(12) United States Patent
Hynecek

(10) Patent No.: US 6,784,412 B2
(45) Date of Patent: Aug. 31, 2004

(54) COMPACT IMAGE SENSOR LAYOUT WITH CHARGE MULTIPLYING REGISTER

(75) Inventor: Jaroslav Hynecek, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 68 days.

(21) Appl. No.: 10/217,181

(22) Filed: Aug. 12, 2002

(65) Prior Publication Data

US 2003/0042400 A1 Mar. 6, 2003

Related U.S. Application Data

(60) Provisional application No. 60/315,816, filed on Aug. 29, 2001.

(51) Int. Cl.[7] .............................................. H01L 27/00
(52) U.S. Cl. ..................................... 250/208.1; 377/57
(58) Field of Search ............................... 250/208.1, 206, 250/214 R, 214 A; 257/E27.154, E27.152, E27.151, E27.15, E29.232, 243, 241; 348/303; 377/57, 63

(56) References Cited

U.S. PATENT DOCUMENTS 5,337,340 A * 8/1994 Hynecek ...................... 377/60
6,278,142 B1 * 8/2001 Hynecek ..................... 257/247
6,444,968 B1 * 9/2002 Burt et al. ................ 250/208.1

* cited by examiner

Primary Examiner—Thanh X. Luu
Assistant Examiner—Seung C Sohn
(74) Attorney, Agent, or Firm—Alan K. Stewart; W. James Brady, III; Frederick J. Telecky, Jr.

(57) ABSTRACT

The image sensing device incorporates a charge multiplication function in its serial register. The design layout is compact in size and the charge multiplication register consists of multi-channel sections that are evenly positioned around the periphery of the image sensing area. The individual charge multiplying register sections are coupled together by only 90-degree multi-channel turns located at the image area array corners. The device allows for the optical image sensing area center to be located near the chip center and consequently near the mechanical package center with the minimum silicon chip area sacrifice.

12 Claims, 2 Drawing Sheets

COMPACT IMAGE SENSOR LAYOUT WITH CHARGE MULTIPLYING REGISTER

This application claims priority under 35 USC §119 (e) (1) of provisional application No. 60/315,816 filed Aug. 29, 2001.

FIELD OF THE INVENTION

The present invention relates to solid-state image sensors, specifically to image sensors that incorporate a Charge Multiplier (CM) in their structure, and more specifically to a design architecture of a CCD image sensor with a charge multiplier in a serial register that has a compact layout.

BACKGROUND OF THE INVENTION

A typical image sensor senses light by converting impinging photons into electrons that are integrated (collected) in sensor pixels. After the integration cycle is completed charge is converted into a voltage that is supplied to the output terminals of the device. The charge to voltage conversion is accomplished either directly in the sensor pixels, such as in Active Pixel CMOS Image Sensors (APS), or remotely off the sensing area, in charge conversion amplifiers. In the remote conversion approach charge must be transported to the sensing amplifier by a well know charge transferring process using various vertical and horizontal Charge Coupled Device (CCD) registers. It has been shown that in the remote sensing approach it is possible to multiply charge as it travels through the registers and thus overcome the limitations that are caused by the high noise floor of the charge detection amplifiers. It is then possible to achieve very high sensor sensitivity, including Single Photon Detection (SPD) similarly as is obtained in Image Intensifiers (II).

U.S. Pat. No. 5,337,340 to Hynecek teaches the basic concept of the charge carrier multiplication used in a typical CCD register. The multiplication is based on a single carrier impact ionization process that is induced by application of suitable clocking voltages to the various device gates. The suitable clocking voltages generate high fields in the structure and when a carrier is injected into these high field regions it gains energy and causes impact ionization. This process thus increases the original number of carriers that arrive at the charge detection node. This is a desirable effect, since the carrier multiplication that is based on single carrier impact ionization is almost noiseless. It is much easier to detect many electrons per single received photon than a single electron by the current state of the art charge detection amplifiers. The noise floor of the present day charge detection amplifiers is approximately 10 electrons, and cannot be easily reduced particularly at high clocking frequencies.

The charge multiplication, however, presents a problem for the design of the CCD registers. As the number of transported carriers gradually increases, larger and larger wells need to be used. This may not be easily accommodated in registers that are restricted in both dimensions by the array pixel pitch. Examples are the vertical registers in Frame Transfer (FT) sensors, Time Delay Integrate (TDI) sensors, or Interline Transfer (IT) sensors. It is thus desirable to incorporate most of the charge multiplication function into horizontal CCD registers whose pixel size is restricted in only one dimension or not at all.

The second problem resulting from the charge multiplication is related to the Dynamic Range (DR) of the charge conversion structures that are located at the input of the charge detection amplifiers. Typically, charge is transferred onto a suitable charge detection node whose capacitance converts arrived charge into an increment of voltage. It is desirable to have a high sensitivity and low noise for the charge conversion. This dictates a very small value for the node capacitance. However, when charge is multiplied, the voltage increment may be so large that the detection node cannot handle it. The available maximum voltage swing thus undesirably limits the DR of the sensor. To avoid this problem it is therefore advantageous to incorporate some DR compression into the sensor.

As shown by the prior art device in FIG. 1, the CCD Frame Transfer area image sensor has an image sensing area 102 with light shielded dark reference pixels 113, memory area 103, and an extended serial register 105. The register 105 is connected to charge multiplication region 106 of a variable pixel width. The charge overflow region 108 follows the multiplier and supplies charge into at least two detection nodes with corresponding amplifiers 109 and 110 that supply signal to the respective output terminals 111 and 112. Voltage Vdd provides the source voltage to amplifiers 109 and 110. Providing suitable bias voltages and clocking signals to the terminals 104, 107, and 114 operate the sensor. An antiblooming structure is biased through terminal 116. By combining the output signals from outputs 111 and 112, that typically have a different conversion gain factor, a piecewise linear transfer characteristic is obtained. This accomplishes the DR compression and avoids the saturation of the output charge detection nodes.

Another prior art example of the FT image sensor that incorporates the charge multiplier in its serial register is shown in FIG. 2. In this case the charge overflow region is built into each charge multiplication stage. This results in a logarithmic transfer characteristic and a register with pixels that requires only a constant width. The regions 102 through 109 and 116 in FIG. 1 correspond directly to the regions 202 through 209 and 216 in FIG. 2. The device of FIG. 2 also includes output 210 and charge detection reset node 212. The DR compression in this case is achieved directly in charge domain by summing charge from charge multiplier 206 with overflow charge in register 208 via the charge summing and detection node 211. The charge domain processing reduces noise and simplifies the off-chip signal processing electronics. In applications where the charge summing is not desired it can be seen by those skilled in the art that a separate output for each channel is easily implemented.

In both prior art examples the extended registers, 105 and 205 along with charge multiplier sections 106 and 206, require a significant increase in the chip area to accommodate the large amount of multiplication stages that are typically needed. Additionally, although registers 105 and 205 along with charge multiplier sections 106 and 206 in the examples in FIGS. 1 and 2 each have only one 180-degree turn, several 180-degree channel turns may be necessary. This is due to the requirement of having the number of extended register stages equal to a multiple of the horizontal sensor pixels. It is typically not possible to maintain the same pixel pitch in the charge multiplier sections 106 and 206 as in the section of the serial register 105 and 205 that interfaces with the array. This results in longer overall register length than the array width and consequently in several register-foldovers with 180-degree turns. The sacrifice in chip area may not be important for FT image sensors, where the memory already occupies a large portion of the silicon chip, but it is important in Interline Transfer image sensors (IT) and in Full Frame (FF) image sensors. One particular application where the chip size is crucial, not only from the cost considerations but also from the packaging point of view, is in endoscopes. In these applications, in addition to keeping the chip size small, it is also necessary to locate the optical center of the image sensing area near the mechanical center of the package. This is very difficult to satisfy with the layout architectures presented in the examples shown in FIG. 1 and FIG. 2.

SUMMARY OF THE INVENTION

It is an object of this invention to provide a compact chip layout for image sensors that have charge multipliers in their serial registers. Furthermore it is an object of this invention to provide chip layout that has the optical center of the image sensing area near the mechanical center of the package. It is an object of this invention to eliminate the need for the 180-degree serial register channel turns in the layout architecture. It is yet another object of the invention to provide a practical image sensor architecture that has a serial register with charge multiplier and only 90-degree-register channel turns. Finally it is an object of this invention to provide a full frame image sensor architecture that includes a charge multiplier and has its array optical center near the package mechanical center.

Incorporating the Charge Multiplier cells into a horizontal register of the CCD image sensor and positioning the extended register sections around the periphery of the image sensing area array achieves these and other objects of the invention.

BRIEF DESCRIPTION OF DRAWINGS

The invention is described in detail in the following description of preferred embodiments with reference to the following figures wherein.

DETAILED DESCRIPTION OF PREFERRED EMBODIMENT

Figure 1:
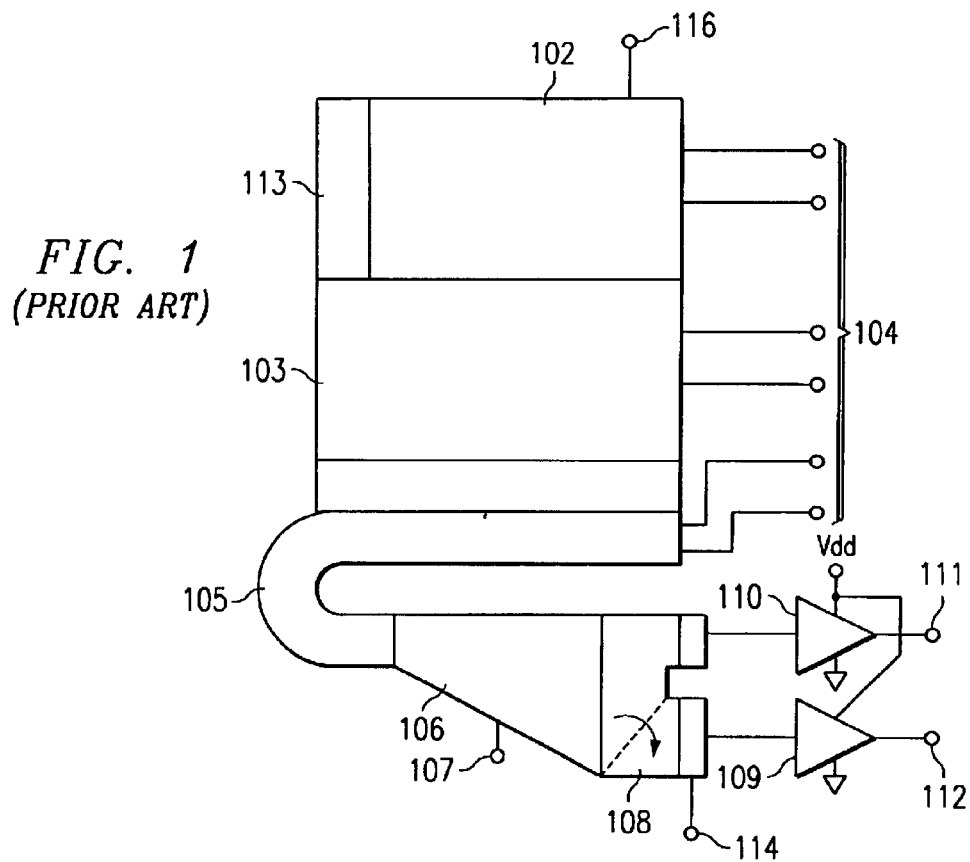
FIG. 1 is a plan view of a typical prior art area image sensor showing an extended serial register that couples to a charge multiplier that has a gradually increasing cell width, charge overflow region, and two outputs with generally different charge conversion gains.
Figure 2:
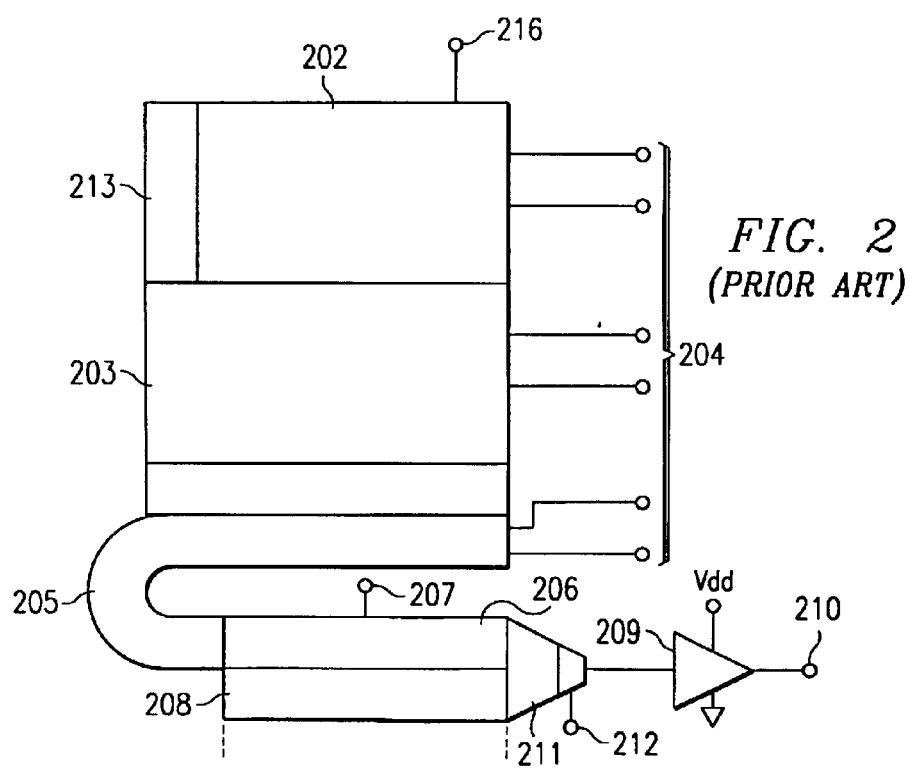
FIG. 2 is a plan view of another prior art area image sensor showing an extended serial register that has constant width and includes a charge multiplier section whose cells incorporate charge overflow regions.
Figure 3:
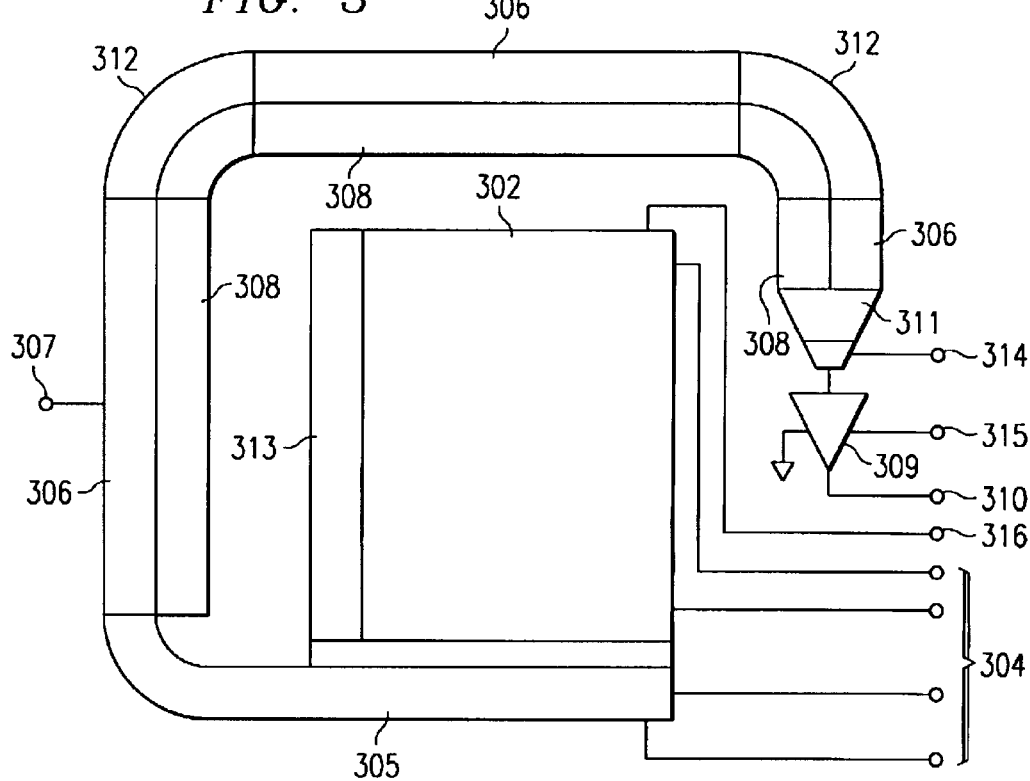
FIG. 3 shows a plan view of a preferred embodiment image sensor architecture with serial register sections that include charge multiplier stages with charge overflow regions.

FIG. 3 shows a plan view of a preferred embodiment full frame CCD area image sensor. The sensor consists of an image sensing area 302 that interfaces with the extended serial register 305. The image sensing area also contains light shielded dark reference pixels 313. The two-phase clocking signals applied to the terminals 304 operate the sensor charge transport registers. The extended serial register 305 is coupled to the charge multiplication register section 306 that consists of specially designed charge multiplication cells. The cells include charge overflow barriers allowing the excess charge to be spilled over to the charge overflow register 308. The charge overflow register runs in parallel with the charge multiplying register and transports overflow charge in a synchronous manner with the multiplied charge. The resulting dual register channel arrangement is efficient in saving the chip area, since it provides DR compression in charge domain without the need for gradually increasing size of the register pixels. The charge multiplication clocking pulses are applied to the charge multiplication gates of the register 306 through the terminal 307. The entire dual channel register 306 and 308 consists of several sections located around the periphery of the image sensing area 302 as shown in FIG. 3. The individual sections are coupled together by dual channel 90-degree turns 312. The charge summing and detection node 311 finally terminates the registers. A reset clock applied to the terminal 314 resets the charge detection node. The detected signal is buffered by an amplifier 309 and is delivered to the device output terminal 310. Amplifier 309 is biased via terminal 315.

Figure 4:
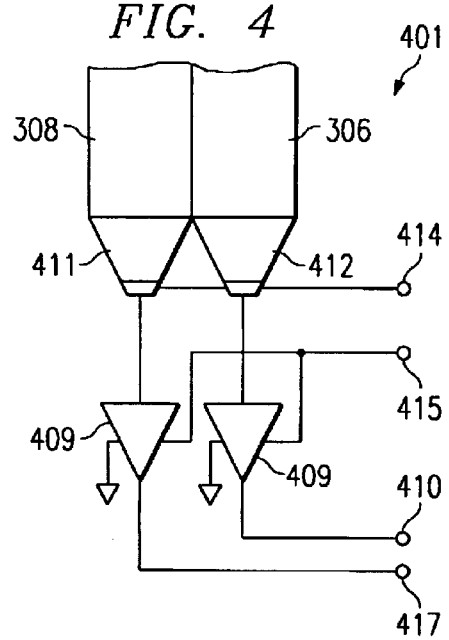
FIG. 4 shows the termination of dual serial registers for the applications where the charge summing is not desired.

FIG. 4 shows the termination of dual serial registers 306/308 for the applications where the charge summing is not desired. In FIG. 4, multiplying register 306 and overflow register 308 are terminated by separate charge detection nodes 411 and 412. A common reset gate that receives its reset clock through the terminal 414 resets the nodes. Two amplifiers 409 buffer the signal and deliver it to the chip output terminals 410 and 417 respectively. The amplifiers are biased via the terminal 415. It is apparent to those skilled in the art that more than two channels can also be implemented, in particular any combination of logarithmic and piecewise linear transfer characteristics can be obtained.

A suitable antiblooming structure may also be included in the sensor array and may be biased through the terminal 316, as shown in FIG. 3.

The above described image sensor layout has several advantages as follows: the peripheral regions of the array 312 are evenly populated by the ancillary structures, which allows the center of the image area to be located near the center of the chip and consequently near the mechanical center of the package. The dual or multiple channel registers perform only 90-degree turns, and are conveniently located at the corners of the array. The chip layout is efficient and compact in size without unnecessary sacrifice of the silicon chip area.

Having described preferred embodiments of the novel semiconductor image sensor with the compact layout architecture, which are intended to be illustrative and not limiting, it is noted that modifications and variations can be made by persons skilled in the art in light of the above teachings. It is therefore to be understood that changes may be made in the particular embodiments of the invention disclosed, which are within the scope and spirit of the invention as defined by the appended claims.

What is claimed is:

1. An image sensing device comprising:
   an image sensing area; and
   a charge multiplication serial register having a first portion extending along a first side of the image sensing area, and a second portion extending along a second side of the image sensing area.

2. The device of claim 1 wherein the charge multiplication serial register comprises:
   a charge multiplication section; and
   a charge overflow section.

3. The device of claim 2 further comprising:
   a first charge detection amplifier coupled to the charge multiplication section; and
   a second charge detection amplifier coupled to the charge overflow section.

4. The device of claim 1 wherein the image sensing device is a charge coupled device.

5. The device of claim 1 wherein the image sensing area is a full frame charge coupled device image sensor.

6. The device of claim 2 further comprising a charge detection amplifier coupled to the charge multiplication section and to the charge overflow section.

7. The device of claim 1 further comprising an extended charge coupled device serial register coupled between the image sensor area and the charge multiplication serial register.

8. A charge coupled device image sensing structure comprising:

an charge coupled device image sensing area;

an extended charge coupled device serial register coupled to the image sensing area, and having a portion of the extended charge coupled device serial register extending along a first side of the charge coupled device image sensing area; and a charge multiplication serial register coupled to the extended register and having a first portion of the charge multiplication serial register extending along a second side of the image sensing area, and a second portion of the charge multiplication serial register extending along a third side of the image sensing area.

9. The structure of claim 8 wherein the charge multiplication serial register is multichannel.

10. The structure of claim 8 wherein the charge multiplication serial register is a dual channel register.

11. The device of claim 8 wherein the charge multiplication serial register comprises:

a charge multiplication channel; and a charge overflow channel.

12. The device of claim 8 wherein the image sensor area is a full frame image sensor.

\* \* \* \* \*